United States Patent
Jeong et al.

(10) Patent No.: US 9,916,414 B2
(45) Date of Patent: Mar. 13, 2018

(54) APPARATUS AND METHOD FOR GENERATING TEST CASES FOR PROCESSOR VERIFICATION, AND VERIFICATION DEVICE

(71) Applicant: Samsung Electronics Co., Ltd., Suwon-si (KR)

(72) Inventors: Seong-Hoon Jeong, Seoul (KR); Moo-Kyoung Chung, Hwaseong-si (KR); Young-Chul Cho, Yongin-si (KR); Hee-Jun Shim, Seoul (KR); Jin-Sae Jung, Yongin-si (KR); Yen-Jo Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 119 days.

(21) Appl. No.: 14/920,548

(22) Filed: Oct. 22, 2015

(65) Prior Publication Data

US 2016/0042116 A1     Feb. 11, 2016

Related U.S. Application Data

(63) Continuation of application No. PCT/KR2014/003505, filed on Apr. 22, 2014.

(30) Foreign Application Priority Data

Apr. 22, 2013   (KR) .................. 10-2013-0044434

(51) Int. Cl.
*G06F 17/50* (2006.01)
*G06F 11/36* (2006.01)

(52) U.S. Cl.
CPC ...... *G06F 17/5081* (2013.01); *G06F 11/3684* (2013.01); *G06F 17/5009* (2013.01)

(58) Field of Classification Search
CPC .................................................. G06F 17/50
(Continued)

(56) References Cited

U.S. PATENT DOCUMENTS

| 6,647,513 | B1 | 11/2003 | Hekmatpour |
| 2008/0039071 | A1 | 2/2008 | Pearce et al. |

(Continued)

FOREIGN PATENT DOCUMENTS

| JP | 6-28208 A | 2/1994 |
| JP | 2011-3658 A | 1/2011 |

(Continued)

OTHER PUBLICATIONS

International Search Report issued on Jul. 30, 2014, in counterpart International Application No. PCT/KR2014/003505 (5 pages, in Korean, including complete English translation).

(Continued)

*Primary Examiner* — Thuan Do
(74) *Attorney, Agent, or Firm* — Harness, Dickey & Pierce, P.L.C.

(57) ABSTRACT

An apparatus for generating a test case includes a constrained description generator configured to define a plurality of constrained verification spaces in a total verification space, and generate a constrained description for each of the plurality of constrained verification spaces; and a test case generator configured to generate a test case using the constrained description.

16 Claims, 4 Drawing Sheets

(58) Field of Classification Search
USPC ......................................................... 716/136
See application file for complete search history.

(56) References Cited

U.S. PATENT DOCUMENTS

| | | |
|---|---|---|
| 2009/0070768 A1 | 3/2009 | Choudhury et al. |
| 2009/0307468 A1 | 12/2009 | Choudhury et al. |
| 2010/0318481 A1 | 12/2010 | Feynman |
| 2011/0131452 A1 | 6/2011 | Kumar et al. |
| 2011/0153306 A1 | 6/2011 | Alapati et al. |
| 2014/0201712 A1* | 7/2014 | Boden ................. G06F 11/3684 717/124 |

FOREIGN PATENT DOCUMENTS

| | | |
|---|---|---|
| JP | 4918907 B2 | 4/2012 |
| KR | 10-2012-0000320 A | 1/2012 |
| KR | 10-2012-0039616 A | 4/2012 |
| KR | 10-2012-0040419 A | 4/2012 |
| KR | 10-2012-0063796 A | 6/2012 |
| KR | 10-1160482 B1 | 6/2012 |

OTHER PUBLICATIONS

Written Opinion of the International Searching Authority issued on Jul. 30, 2014, in counterpart International Application No. PCT/KR2014/003505 (9 pages, in Korean, including complete English translation).

* cited by examiner

APPARATUS AND METHOD FOR GENERATING TEST CASES FOR PROCESSOR VERIFICATION, AND VERIFICATION DEVICE

CROSS-REFERENCE TO RELATED APPLICATION(S)

This application is a continuation of International Application No. PCT/KR2014/003505 filed on Apr. 22, 2014, which claims the benefit of Korean Patent Application No. 10-2013-0044434 filed on Apr. 22, 2013, in the Korean Intellectual Property Office, the entire disclosures of which are incorporated herein by reference for all purposes.

BACKGROUND

1. Field

This application relates to an apparatus and method for generating test cases for processor verification, and a verification device for verifying a processor.

2. Description of Related Art

A random test case generator for processor verification is designed to generate a number of random test cases (e.g., test case programs) to test a target design. However, a general random test case generator is likely to generate a redundant test case, that is, a test case that has been already tested. Thus, a superficially different, but functionally identical/similar, test is performed, degrading an efficiency of processor verification

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for generating a test case includes a constraint generator configured to define a plurality of constrained verification spaces in a total verification space, and generate a constrained description for each of the plurality of constrained verification spaces; and a test case generator configured to generate a test case using the constrained description.

The apparatus may further include an architecture generator configured to define the total verification space using an architecture specification, and generate an architecture description for the total verification space.

The architecture specification may include any one or any combination of any two or more of instruction information, operand information, instruction sequence information, and interrupt information.

The architecture generator may be further configured to define the total verification space in a multidimensional space by combining two or more types of the information contained in the architecture specification.

The constraint generator may be further configured to define the plurality of constrained verification spaces in the total verification space by taking into account any one or any combination of any two or more of a size of the total verification space, a test purpose, and a test time.

The constraint generator may be further configured to generate the constrained description for each of the plurality of constrained verification spaces sequentially.

The test case generator may be further configured to generate only one random test case in each of the plurality of constrained verification spaces to avoid redundant test cases.

In another general aspect, a method of generating a test case includes defining, using computing hardware, a plurality of constrained verification spaces in a total verification space; generating, using the computing hardware, a constrained description for each of the plurality of constrained verification spaces; and generating, using the computing hardware, a test case using the constrained description.

The method may further include defining the total verification space using an architecture specification; and generating an architecture description for the total verification space.

The architecture specification may include any one or any combination of any two or more of instruction information, operand information, instruction sequence information, and interrupt information.

The defining of the total verification space may include defining the total verification space in a multidimensional space by combining two or more types of the information contained in the architecture specification.

The defining of the plurality of constrained verification spaces may include defining the plurality of constrained verification spaces in the total verification space by taking into account any one or any combination of any two or more of a size of the total verification space, a test purpose, and a test time.

The generating of the constrained description may include generating the constrained description for each of the plurality of constrained verification spaces sequentially.

The generating of the test case may include generating only one random test case in each of the plurality of constrained verification spaces to avoid redundant test cases.

In another general aspect, a verification device includes a verification supporter configured to define a plurality of constrained verification spaces in a total verification space of a processor, and generate a random test case in each of the plurality of constrained verification spaces; and a verifier configured to simulate the generated test cases, and verify the processor based on simulation test results obtained by the simulation.

The verification supporter may be further configured to define the total verification space using an architecture specification including any one or any combination of any two or more of instruction information, operand information, instruction sequence information, and interrupt information.

The verification supporter may be further configured to define the plurality of constrained verification spaces in the total verification space by taking into account any one or any combination of any two or more of a size of the total verification space, a test purpose, and a test time.

The verifier may be further configured to verify the processor by generating respective reference test results for the test cases, and comparing the simulation test results with the reference test results.

In another general aspect, an apparatus for generating a test case includes a constraint generator configured to define a plurality of constrained verification spaces in a total verification space, and generate constrained descriptions respectively describing the constrained verification spaces; and a test case generator configured to generate at least one test case in at least some of the constrained verification spaces using the constrained descriptions.

The constraint generator may be further configured to divide the total verification space into a plurality of equal-sized constrained verification spaces.

The constraint generator may be further configured to divide only a portion of the total verification space into a plurality of constrained verification spaces;

The constraint generator may be further configured to divide a portion of the total verification space into a plurality of first constrained verification spaces having a first size, and divide a remaining portion of the total verification space into a plurality of second constrained verification spaces having a second size larger than the first size.

The total verification space may be a multidimensional total verification space; and the constraint generator may be further configured to define a plurality of multidimensional constrained verification spaces in the multidimensional total verification space.

The test case generator may be further configured to generate only one test case in each of the constrained verification spaces.

The test generator may be further configured to generate two or more non-redundant test cases in each of the constrained verification spaces.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, an apparatus and method for generating test cases for processor verification and a verification device are described in detail with reference to the drawings.

Figure 1:
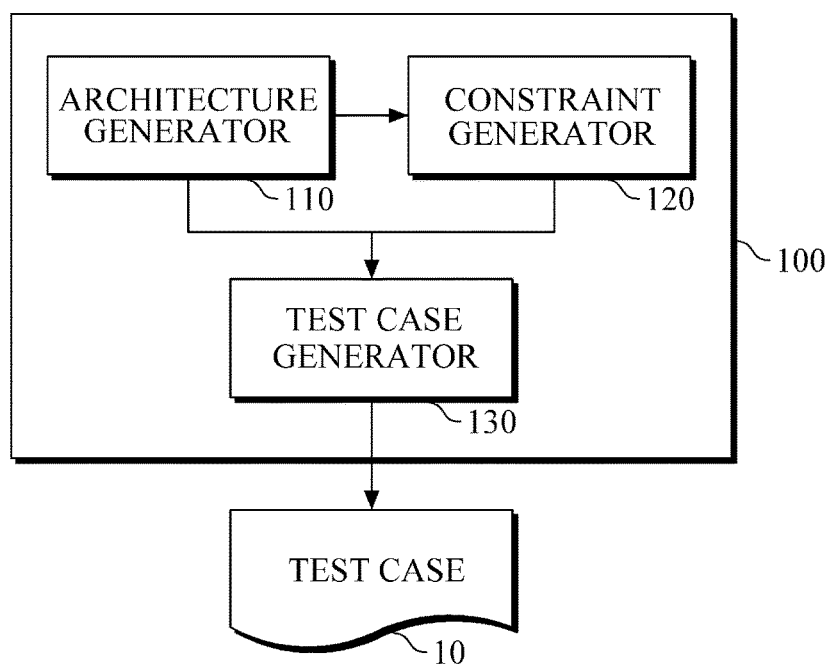
FIG. 1 is a block diagram illustrating an example of an apparatus for generating a test case.
Figure 2:
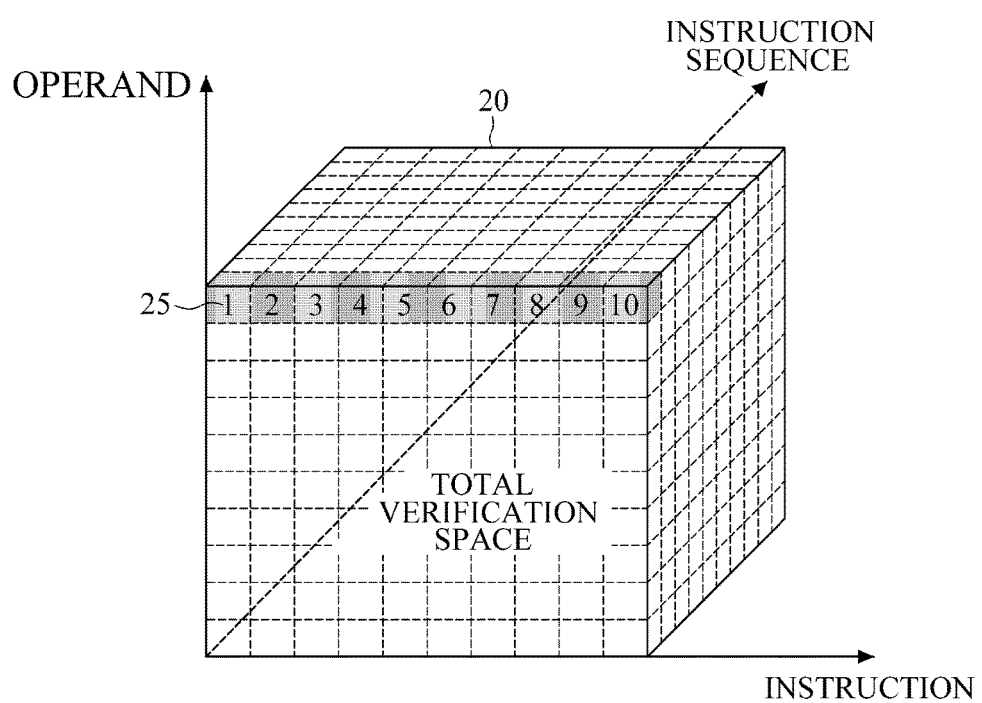
FIG. 2 illustrates an example of an example of a total verification space.

FIG. 1 is a block diagram illustrating an example of an apparatus for generating a test case, and FIG. 2 illustrates an example of a total verification space.

Referring to FIGS. 1 and 2, an apparatus 100 for generating a test case includes an architecture generator 110, a constraint generator 120, and a test case generator 130.

Using an architecture specification, the architecture generator 110 generates a total verification space 20 to verify a processor. The architecture specification includes various types of information about the processor, including instruction information, operand information, instruction sequence information, and interrupt information. The architecture generator 110 checks various types of information about the processor based on the architecture specification, and generates the total verification space 20 based on some or all of the various types of information.

For example, as shown in FIG. 2, the architecture generator 110 may define the total verification space 20 in a three-dimensional (3D) space using three types of information among various types of information in the architecture specification, and the three types of information may include instruction information, operand information, and instruction sequence information. As such, the architecture generator 110 defines a total verification space 20 in a multidimensional space using an appropriate number of types of information according to a test purpose.

After the total verification space 20 is defined as shown in FIG. 2, the architecture generator 110 generates an architecture description for the total verification space 20 by writing the defined total verification space 20 in a predetermined programming language (e.g., the C language). The generated architecture description is used as an input to the constraint generator 110 to be used in defining a constrained verification space as described in the following.

Referring to FIG. 2, the constraint generator 120 defines a plurality of constrained verification spaces 25 in the total verification space 20 defined by the architecture generator 110. Each of the ten pieces highlighted in gray and numbered 1-10 in FIG. 2 is a separate constrained verification space 25. If the total verification space 20 is a multidimensional total verification space, the constrained verification spaces 25 may be multidimensional constrained verification spaces. The constraint generator 120 checks the total verification space 20 using the architecture description written for the total verification space 20 by the architecture generator 110, and defines at least two constrained verification spaces 25 for randomly generating a test case in the total verification space 20. The constraint generator 120 defines an appropriate number of constrained verification spaces 25 by taking into account a size of the total verification space 20, a test purpose, and a test time.

For example, if it is expected to take a long time to test a processor because the total verification space 20 is very large, the constraint generator 120 may define a relatively great number of constrained verification spaces 25. In another example, if a relatively simple test is to be performed, the constraint generator 120 may define a relatively small number of constrained verification spaces 25. Likewise, the constraint generator 120 may adjust the number of constrained verification spaces 25 according to an amount of time required for performing a test.

In the example in FIG. 2, the total verification space 20 is evenly divided into 1000 pieces, so that a total of 1000 constrained verification spaces 25 are defined. As such, by evenly dividing the total verification space 20 into an appropriate number of equal-sized pieces, the constraint generator 120 is able to generate consistent test cases, thereby making it possible to equally test the total verification space 20.

In still another example, a part of the total verification space 20 with a specific distribution is divided into smaller pieces for an intensive test, so that a relatively greater number of constrained verification spaces are defined for the intensive test in that part of the total verification space 20, but the remaining part of the total verification space 20 is divided into larger pieces for a simple test so that a relatively smaller number of constrained verification spaces are defined for the simple test in the remaining part of the total verification space 20.

In yet another example, the constraint generator 120 generates a constrained verification space 25 in only a part of the total verification space 25 with a specific distribution so that only that part of the total verification space 20 with the specific distribution can be tested according to a test purpose.

After a plurality of constrained verification spaces 25 are defined, the constraint generator 120 defines a constrained description for each constrained verification space 25. The constraint generator 120 may generate constrained descriptions for a plurality of constrained verification spaces 25 sequentially, and the generated constrained descriptions may be input to the test case generator 130 sequentially.

The following Table 1 is an example of a constrained description generated by the constraint generator 120.

TABLE 1

```
void CSL::CCEGenerator::CSL_main(unsigned int seed, string
outputPath)
{
  RandomVLIWSchedule s;
  AppendSchedule(s);
  s.Add(NofOperationConstraint(opnum));
  RandomOperationGenerator*rog = new RandomOperationGenerator( );
  rog->SetDefaultWeight(0);
  rog->Add(OperationGroup("add"),Operand(0x00000000,0x11111111),
  Instsequence(3));
  s.SetGlobalGenerator(rog);
  Emit( );
}
```

Referring to Table 1 that defines a constrained verification space, in line 8, an instruction indicates an "add" operation group, an operand ranges from 0x00000000 to 0x11111111, and an instruction sequence shows a sequence of three random operations among the "add" operation group.

The test case generator 130 comprehends the total verification space 20 using the generated architecture description. In addition, the test case generator 130 checks a constrained verification space for which a random test case 10 is to be generated using the generated architecture description, and then generates one or more random test cases 10 in each constrained verification space to avoid redundancy of a test case.

For example, the test case generator 130 checks a constrained verification space 25 using constrained descriptions sequentially input from the constraint generator 120, and then randomly generates a test case in the constrained verification space 25. As such, the test case generator 130 generates only one random test case 10 in each constrained verification space 15 sequentially, so that none of the generated test cases 10 are redundant.

However, only one random test case is not necessarily generated in one constrained verification space 25. That is, the test case generator 130 may generate two or more non-redundant test cases in one constrained verification space 25 to avoid redundancy of a test case.

In FIG. 2, as only one test case or two or more non-redundant test cases are generated in each non-redundant constrained verification space, the chances that a redundant test will be performed is remote, thereby improving an efficiency of a verification processor. In addition, since a non-redundant random test case is generated before a test is performed, there is no dependency between test cases, so that the entire verification processor may be paralleled.

Figure 3:
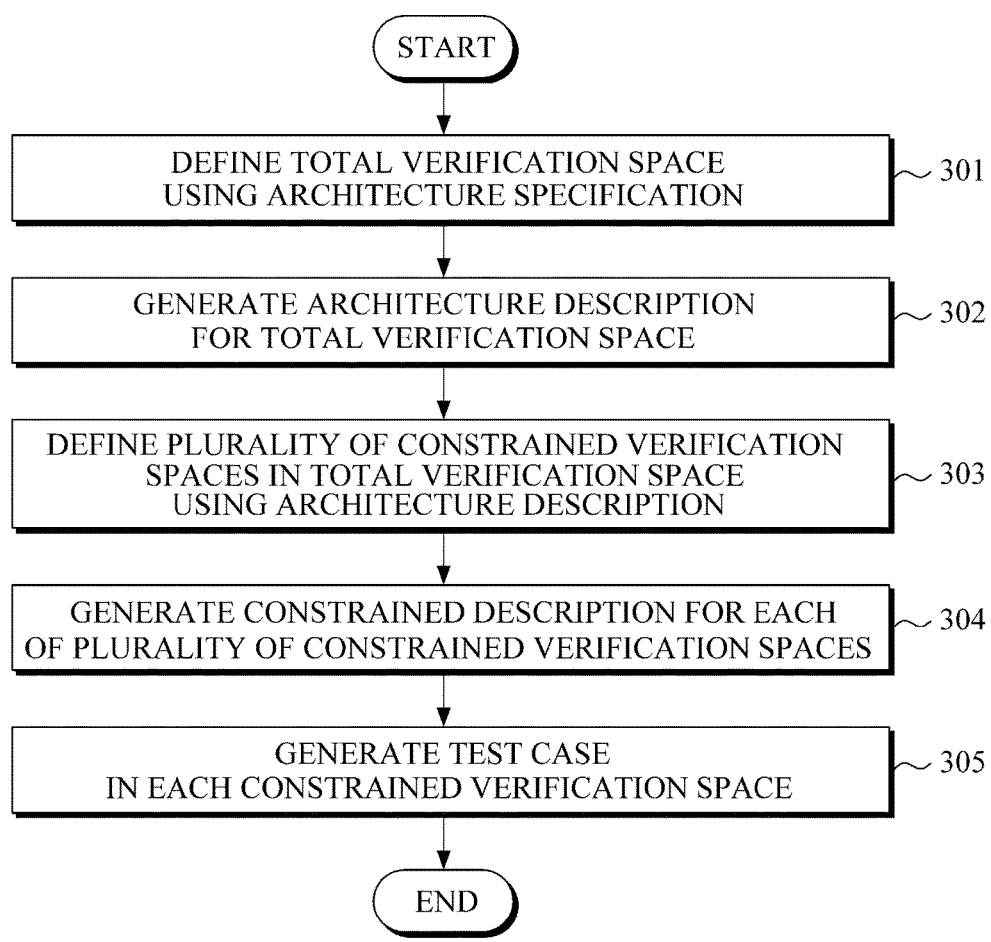
FIG. 3 is a flow chart illustrating an example of a method of generating a test case.

FIG. 3 is a flow chart illustrating an example of a method of generating a test case. The method described with reference to FIG. 3 may be implemented by the apparatus 100 shown in FIG. 1.

Referring to FIG. 3, in the method of generating a test case, the apparatus defines a total verification space to verify a processor using an architecture specification in 301. As described above, the apparatus defines the total verification space using an architecture specification, such as instruction information, operand information, instruction sequence information, and interrupt information, that is defined regarding the processor.

After the total verification space is defined, the apparatus generates an architecture description for the defined total verification space in 302. The architecture description may be written in a predetermined programming language (e.g., the C language).

Then, the apparatus 100 checks the total verification space using the generated architecture description and defines a plurality of constrained verification space in the total verification space in 303. For example, the apparatus 100 defines a small number of constrained verification spaces if a test purpose is to make a test simple, and a greater number of constrained verification spaces if a test purpose is to achieve a higher accuracy. Likewise, the apparatus 100 may define an appropriate number of constrained verification spaces by taking into consideration a size of the total verification space, a test purpose, and an amount of time required for the test.

Meanwhile, in one example, the total verification space may be evenly divided into equal-sized pieces so that it is possible to perform a consistent test for the total verification space. In still another example, the total verification space may be divided such that only a specific part of the total verification space is divided into smaller pieces to perform an intensive test for the specific part. In yet another example, the total verification space may be divided such that a specific part of the total verification space is divided into smaller pieces to perform an intensive test for the specific part, while the remaining part of the total verification space is divided into larger pieces to perform a relatively simple test for the remaining part of the total verification space.

After a plurality of constrained verification spaces are defined, the apparatus 100 generates a constrained description for each of the constraint verifications spaces in 304. As shown in the above Table 1, a constrained description may be written in a predefined programming language. Constrained descriptions for a plurality of constrained verification spaces may be generated sequentially.

Then, the apparatus 100 checks a constrained verification space for which a random test case is to be generated using the generated constrained description, and generates one or more random test cases for each constrained verification space. As described above, redundancy of a test case may be avoided by generating only one random test case in each of a plurality of constrained verification spaces. Alternatively, the apparatus 100 may generate two or more non-redundant random test cases in the same constrained verification space.

Figure 4:
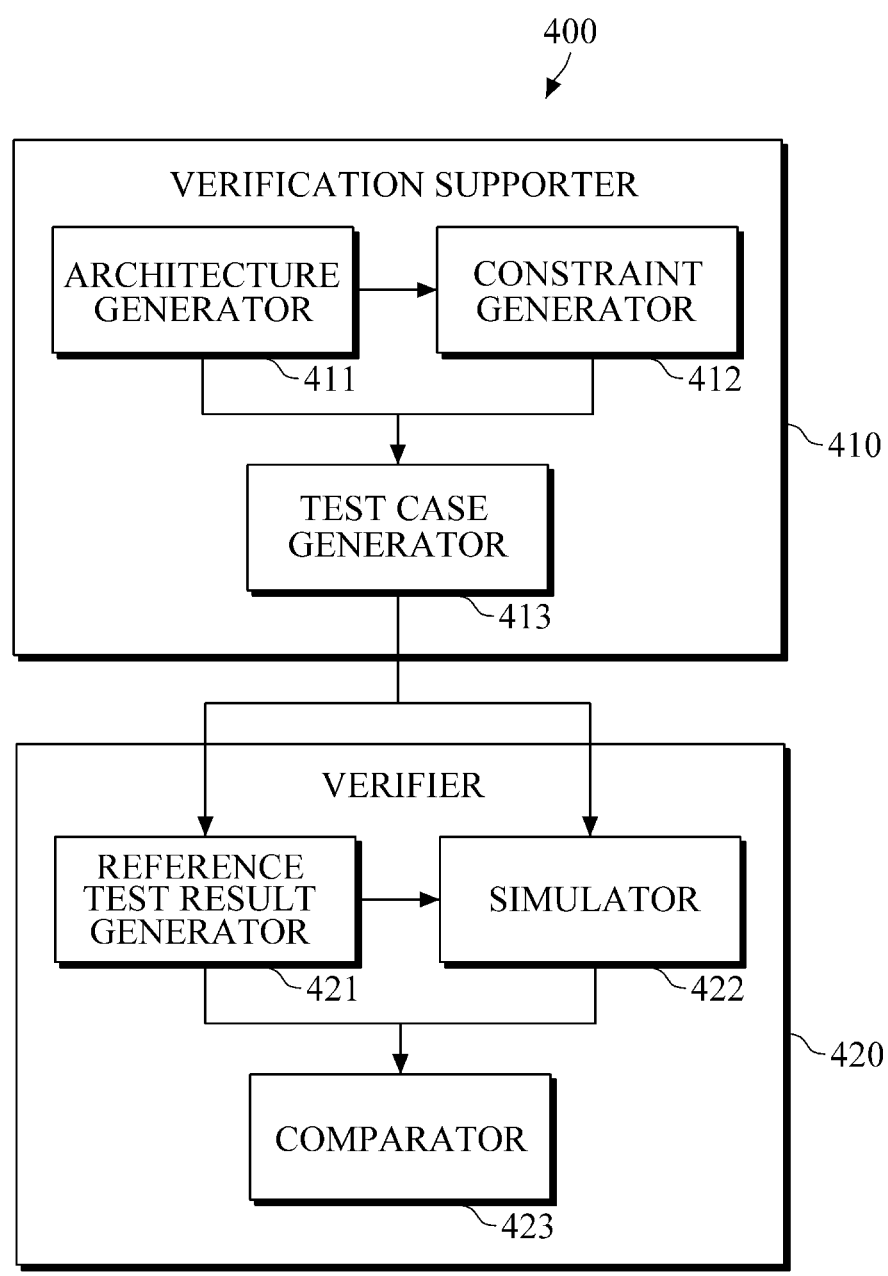
FIG. 4 is a block diagram illustrating an example of a verification device.

FIG. 4 is a block diagram illustrating an example of a verification device.

Referring to FIG. 4, a verification device 400 includes a verification supporter 410 and a verifier 420. The verification supporter 410 may be constituted by the apparatus 100 for generating a test case shown in FIG. 1. In addition, both the verification supporter 410 and the verifier 420 may be provided in one hardware device, or, if necessary, in different hardware devices.

As the apparatus 100 that constitutes the verification supporter 410 has been described in detail with reference to FIG. 1, only essential and brief descriptions about the verification supporter 410 will be provided to avoid a redundant explanation.

As illustrated in FIG. 4, the verification supporter 410 includes an architecture generator 411, a constraint generator 412, and a test case generator 413.

Using an architecture description, such as instruction information, operand information, instruction sequence information, and interrupt information, which are various kinds of information defined regarding a processor, the architecture generator 411 defines a total verification space to verify the processor.

The constraint generator 412 generates a plurality of constrained verification spaces in the defined total verification space. The constraint generator 412 generates an appropriate number of constrained verification spaces by taking into consideration a test purpose, a size of the total verification space, and an amount of time required for the test. The total verification space may be divided evenly to define equal-sized constrained verification spaces, or only a part of the total verification space with a specific distribution may be divided to define constrained verification spaces to perform an intensive test on that part of the total verification space. Alternatively, a part of the total verification space with a specific distribution may be divided into a relatively large number of constrained verification spaces for a more accurate test, while the remaining part of the total verification space may be divided into a relatively small number of constrained verification spaces.

The test case generator 413 generates one or more random test cases to prevent a redundant test case in the same verification space. For example, if only one test case is generated in each constrained verification space, it is possible to avoid redundancy of a test case, so that any actual test is not performed redundantly in the same constrained verification space.

After the test case generator 413 of the verification supporter 410 generates a random test case in each constrained verification space, the verifier 420 performs a simulation using each random test case as an input. Referring to FIG. 4, the verifier 420 includes a reference test result generator 421, a simulator 422, and a comparator 423, and the reference test result generator 421 generates a reference test result for a generated test case. In this case, the reference test result may be written in a predetermined programming language, such as the C language or the Hardware Description Language (HDL). The simulator 422 simulates an input test case to thereby generate a simulation test result, and the comparator 423 compares the reference test result generated by the reference test result generator 421 with the simulation test result generated by the simulator 422, and generates a comparison result indicating true if the simulation test result matches the reference test result, or false if the simulation test result does not match the reference rest result.

According to the examples described above, when random test cases are generated for processor verification, redundant test cases may be prevented from being generated, and test cases of a desired specific distribution may be generated according to a test purpose and other factors, thereby increasing an efficiency of processor verification.

The architecture generator 110, the constraint generator 120, and the test case generator 130 in FIG. 1 and the architecture generator 411, the constraint generator 412, the test case generator 413, the reference test result generator 421, the simulator 422, and the comparator 423 in FIG. 4 that perform the operations described herein with respect to FIGS. 1-4 are implemented by hardware components. Examples of hardware components include controllers, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-4. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 3 that performs the operations described herein with respect to FIGS. 1-4 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for generating a test case for verifying a computer processor design, the apparatus comprising:
    at least one processor configured to execute computer readable instructions to,
        define a total verification space using a computer processor architecture specification, the total verification space based on information types included in the computer processor architecture specification associated with the computer processor design,
        generate a computer processor architecture description for the total verification space,
        define a plurality of constrained verification spaces in the total verification space based on the computer processor architecture description,
        generate a constrained description for each of the plurality of constrained verification spaces,
        generate at least one test case for verifying the computer processor design using each of the constrained descriptions, and
        verify the computer processor design based on the at least one test case and a simulation of the computer processor design.

2. The apparatus of claim 1, wherein the computer processor architecture specification comprises at least one of: instruction information, operand information, instruction sequence information, and interrupt information associated with the computer processor design.

3. The apparatus of claim 2, wherein the at least one processor is further configured to define the total verification space in a multidimensional space by combining two or more types of the information contained in the computer processor architecture specification.

4. The apparatus of claim 1, wherein the at least one processor is further configured to define the plurality of constrained verification spaces in the total verification space based on one or more of: a size of the total verification space, a test purpose, and a test time.

5. The apparatus of claim 1, wherein the at least one processor is further configured to generate the constrained description for each of the plurality of constrained verification spaces sequentially.

6. The apparatus of claim 1, wherein the at least one processor is further configured to generate only one random test case in each of the plurality of constrained verification spaces to avoid redundant test cases.

7. A method of generating a test case for verifying a computer processor design, the method comprising:
    defining, using at least one processor, a total verification space using a computer processor architecture specification, the total verification space based on information types included in the computer processor architecture specification associated with the computer processor design;
    generating, using the at least one processor, a computer processor architecture description for the total verification space;
    defining, using the at least one processor, a plurality of constrained verification spaces in the total verification space based on the computer processor architecture description;
    generating, using the at least one processor, a constrained description for each of the plurality of constrained verification spaces;
    generating, using the at least one processor, at least one test case for verifying the computer processor design using each of the constrained descriptions; and
    verifying, using the at least one processor, the computer processor design based on the at least one test case and a simulation of the computer processor design.

8. The method of claim 7, wherein the computer processor architecture specification comprises at least one of: instruction information, operand information, instruction sequence information, and interrupt information associated with the computer processor design.

9. The method of claim 8, wherein the defining of the total verification space comprises defining the total verification space in a multidimensional space by combining two or more types of the information contained in the computer processor architecture specification.

10. The method of claim 7, wherein the defining of the plurality of constrained verification spaces comprises defining the plurality of constrained verification spaces in the total verification space based on one or more of: a size of the total verification space, a test purpose, and a test time.

11. The method of claim 7, wherein the generating of the constrained description comprises generating the constrained description for each of the plurality of constrained verification spaces sequentially.

12. The method of claim 7, wherein the generating of the test case comprises generating only one random test case in each of the plurality of constrained verification spaces to avoid redundant test cases.

13. A verification device for verifying a computer processor design, the verification device comprising:
 a verification supporter device configured to,
  define a total verification space using a computer processor architecture specification, the total verification space based on information types included in the computer processor architecture specification associated with the computer processor design,
  generate a computer processor architecture description for the total verification space,
  define a plurality of constrained verification spaces in the total verification space based on the computer processor architecture description,
  generate at least one random test case for verifying the computer processor design using each of the plurality of constrained verification spaces; and
 a verifier configured to,
  simulate the generated test cases based on the computer processor design, and
  verify the computer processor design based on simulation test results obtained by the simulation.

14. The verification device of claim 13, wherein the verification supporter device is further configured to define the total verification space using the computer processor architecture specification comprising at least one of: instruction information, operand information, instruction sequence information, and interrupt information associated with the computer processor design.

15. The verification device of claim 13, wherein the verification supporter device is further configured to define the plurality of constrained verification spaces in the total verification space based on one or more of: a size of the total verification space, a test purpose, and a test time.

16. The verification device of claim 13, wherein the verifier is further configured to:
 verify the computer processor design by generating respective reference test results for each of the test cases; and
 comparing the simulation test results with the reference test results.

* * * * *